United States Patent
Shinohara

[11] Patent Number: 6,084,292
[45] Date of Patent: Jul. 4, 2000

[54] LEAD FRAME AND SEMICONDUCTOR DEVICE USING THE LEAD FRAME

[75] Inventor: Toshiaki Shinohara, Tokyo, Japan

[73] Assignee: Mitsubishi Denki Kabushiki Kaisha, Tokyo, Japan

[21] Appl. No.: 09/028,660

[22] Filed: Feb. 24, 1998

[30] Foreign Application Priority Data

Aug. 19, 1997 [JP] Japan ................................. 9-222729

[51] Int. Cl.[7] ............................ H01L 23/495; H05K 5/02
[52] U.S. Cl. ......................... 257/676; 257/666; 257/672; 361/813
[58] Field of Search ................................. 257/676, 666, 257/672; 438/123; 361/813

[56] References Cited

FOREIGN PATENT DOCUMENTS

| | | |
|---|---|---|
| 394459 | 4/1991 | Japan . |
| 5-21649 | 1/1993 | Japan ........................................ 257/666 |
| 5-275603 | 10/1993 | Japan ........................................ 257/666 |
| 8306853 | 11/1996 | Japan . |
| 98207 | 1/1997 | Japan . |

Primary Examiner—Mahshid Saadat
Assistant Examiner—Jhihan B. Clark
Attorney, Agent, or Firm—Leydig, Voit & Mayer, Ltd.

[57] ABSTRACT

A lead frame includes a conductive base plate having a first surface on which a semiconductor element is to be mounted and a second surface opposite to the first surface, a lead forming portion arranged on the first surface of the conductive base plate, in a concavity in the first surface through etching by masking at least the lead forming portion. The lead forming portions are coupled with one another, and are not independent. Thus, bending of the lead forming portion in a lead frame is avoided. A semiconductor device using the lead frame, and methods for manufacturing the lead frame are also disclosed.

16 Claims, 18 Drawing Sheets

F I G. 12(a)
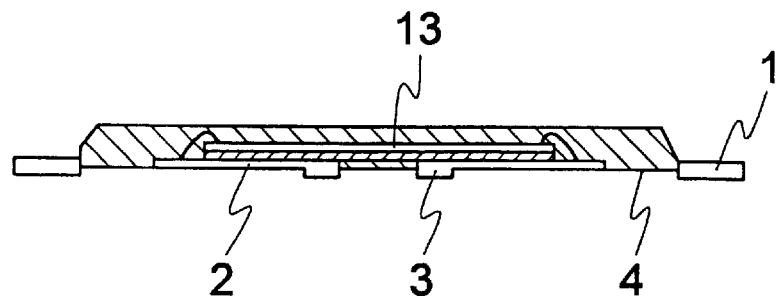
F I G. 12(b)
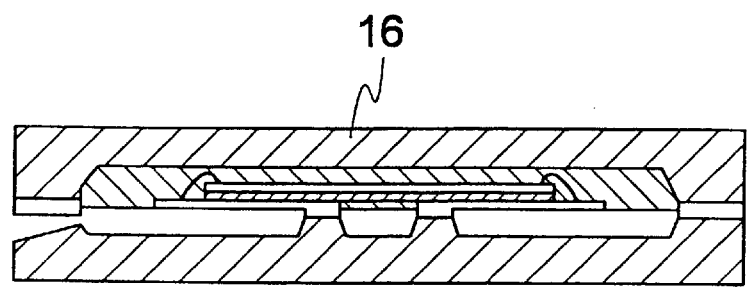
F I G. 12(c)
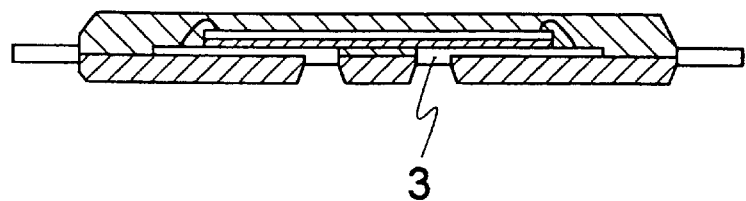
F I G. 12(d)
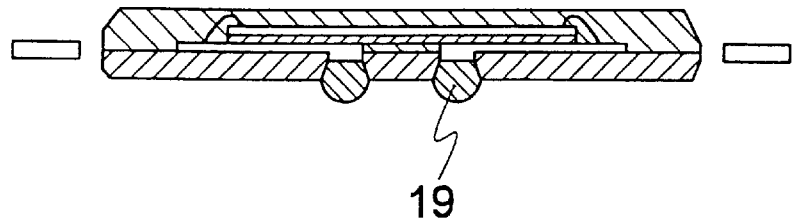

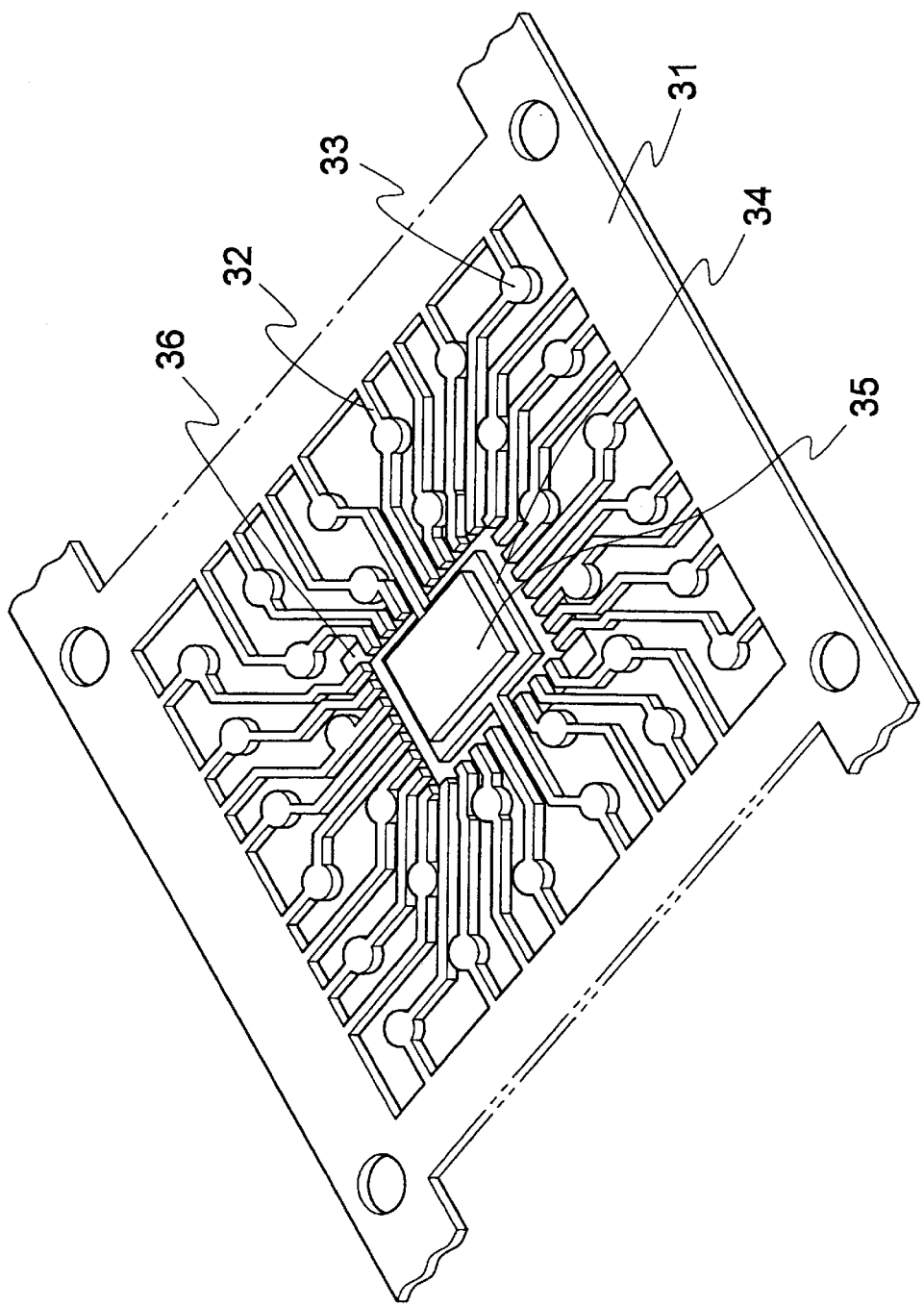

LEAD FRAME AND SEMICONDUCTOR DEVICE USING THE LEAD FRAME

BACKGROUND OF THE INVENTION

The present invention relates to a lead frame for a semiconductor device, a semiconductor device using the lead frame, and a method for manufacturing the semiconductor device.

FIG. 18 is a perspective view of a conventional lead frame. In FIG. 18, numeral 31 denotes a frame, numeral 32 a half-etched inner lead formed continuously with the frame 31, numeral 33 an external terminal leading portion of the inner lead 32, numeral 34 a die pad, numeral 35 a chip placed on the die pad 34, and numeral 36 a support tape for supporting the inner lead 32.

FIG. 19 is a semiconductor device which is formed with the use of the conventional lead frame. In FIG. 19, numeral 37 denotes a die bond material for bonding a chip 35 on a die pad 34, numeral 38 a bonding wire for connecting an inner lead 32 with a bonding pad of the chip 35, numeral 39 a sealing resin for sealing the inner lead 32 and the chip 35, and numeral 40 a soldering ball on an external terminal leading portion 33.

The conventional lead frame shown in FIG. 18 and FIG. 19 has many inner leads 32. Each inner lead is so narrow that it is weak in mechanical strength. To reinforce the tip end or the intermediate position of the lead to be wire-bonded and to avoid defects, such as bending, it is necessary to adhere a support tape 36 to portions requiring reinforcement as shown in FIGS. 18 and 19. With respect to the die pad 34, it is necessary to provide an inner lead for support or to provide reinforcement by adhering a support tape as in the described inner lead.

For example, in Japanese Unexamined Patent Publication No. Hei. 3-94459, there is introduced a technology of forming a terminal by etching, after a chip is mounted, with the use of a metal base on which no lead is formed. The technology is not, however, suitable for formation of the lead frame.

A primary object of the present invention is to solve such a problem, and to provide a lead frame capable of avoiding defects such as bending in the lead frame body without using the support tape.

A second object of the invention is to provide a lead frame capable of fine processing and use even in a semiconductor device having a Chip Scale Package (CSP) structure.

A third object of the invention is to provide a method for manufacturing such a lead frame.

Further, a fourth object of the invention is to provide a semiconductor device having a CSP structure or the like using such a lead frame.

A fifth object of the invention is to provide a method for manufacturing such a semiconductor device.

SUMMARY OF THE INVENTION

In accordance with the present invention, there is provided a lead frame comprising a conductive base plate having a first surface on which a semiconductor element is mounted and a second surface opposite to the first surface, a lead forming portion arranged on the first surface of the conductive base plate, and a concave formed on the first surface through etching by masking at least the lead forming portion.

The lead forming portion is so arranged as to extend towards a central portion from a peripheral portion of the conductive base plate.

The conductive base plate has four sides, and the lead forming portion is so arranged as to extend towards a central portion from each side of the conductive base plate.

The lead forming portion has a lead terminal arranged on a periphery portion of the conductive base plate, and a connecting portion, to be connected with a semiconductor element, arranged on a central portion of the conductive base plate.

The central portion of the first surface of the conductive base plate has a die bond portion for mounting thereon a semiconductor element.

The central portion of the second surface of the conductive base plate has a concave reaching to the concave of the first surface, and an end portion of the lead forming portion of the first surface is exposed.

The lead forming portion has a lead terminal portion arranged in the central portion of the conductive base plate, and a connecting portion, to be connected with the semiconductor element, arranged on the periphery portion of the conductor base plate.

In the semiconductor device of the present invention wherein a semiconductor element is mounted on a first surface of the conductive base plate of the lead frame, and the first surface and the semiconductor element are sealed with resin, the semiconductor device further includes a lead obtained by etching a second surface of the conductive base plate and connected with the semiconductor element, and an insulating member for covering the second surface except a terminal portion of the lead.

In accordance with the present invention, there is further provided a method for manufacturing a semiconductor device comprising: a first step of forming a concave through etching by masking at least a lead forming portion on a first surface of a lead frame, a second step of mounting a semiconductor element on the first surface and connecting the semiconductor element with the lead forming portion, a third step of sealing the first surface and the semiconductor element with resin, a fourth step of etching a second surface opposite to the first surface of the lead frame to form a lead, and a fifth step of covering the second surface with an insulating member except a terminal portion of the lead.

The second step is conducted after etching a central portion of the second surface opposite to the first surface of the lead frame to form a concave reaching the concave on the first surface of the lead frame, and exposing an end portion of the lead forming portion of the first surface.

The first step simultaneously conducts an etching operation of forming the concave on the first surface of the lead frame and an etching operation of forming a concave reaching the concave of the first surface in a central portion of the second surface for exposing an end portion of the lead forming portion of the first surface.

In accordance with the present invention, there is also provided a method for manufacturing a lead frame comprising a first step of forming a concave through etching by masking at least a lead forming portion on the first surface of the conductive base plate, and a second step of etching a central portion of the second surface opposite to the first surface of the conductive base plate to form a concave reaching a concave of the first surface of the lead frame, and exposing the end portion of the lead forming portion of the first surface.

Furthermore, the first step and the second step are conducted at the same time.

BRIEF DESCRIPTION OF THE DRAWINGS

FIGS. 12(a)–12(d) are views showing steps of manufacturing a semiconductor device according to Embodiment 6 of the present invention;

FIG. 18 is a perspective view showing the conventional lead frame; and

DETAILED DESCRIPTION OF THE INVENTION

Embodiment 1

Figure 1:
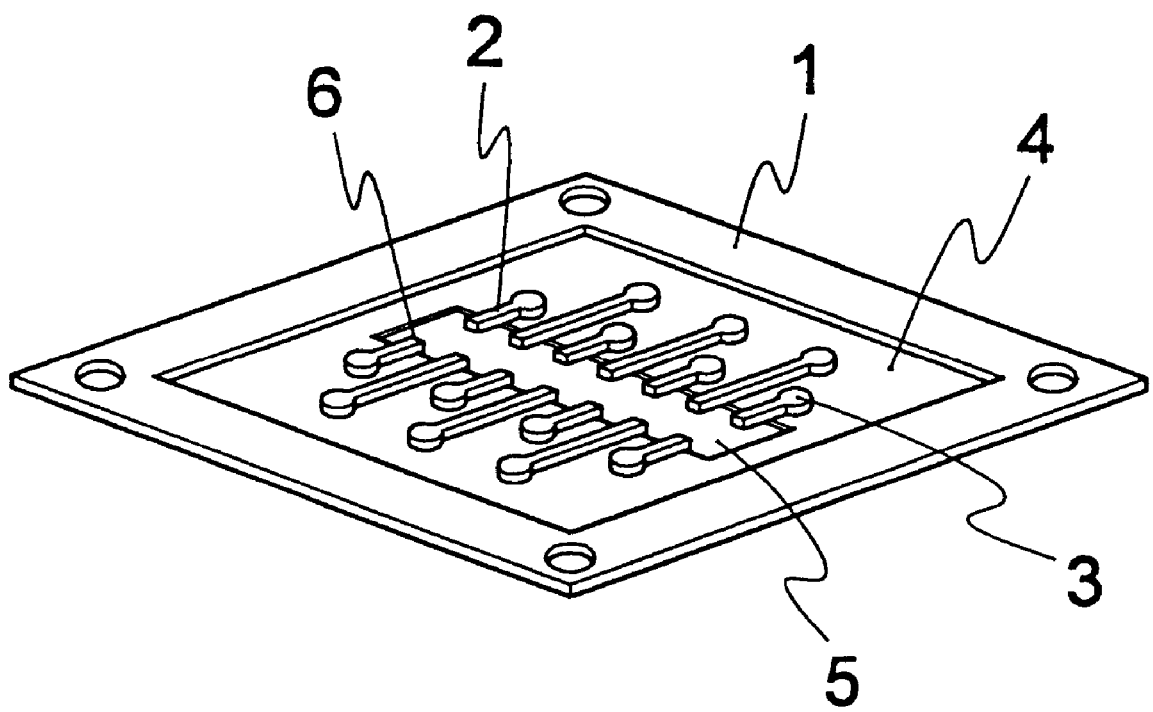
FIG. 1 is a perspective view showing a lead frame according to Embodiment 1 of the present invention.

FIG. 1 is a perspective view showing a lead frame according to Embodiment 1 of the present invention.

FIGS. 2(a)–2(d) and FIGS. 3(a)–3(c) are views showing a method for manufacturing a lead frame shown in FIG. 1.

In FIGS. 1 and 2, numeral 1 denotes a lead frame, numeral 2 a lead formed by half-etching (described later) of the lead frame 1, numeral 3 a lead terminal to be connected to an external circuit of the lead 2, numeral 4 a half-etched portion of the lead frame 1, numeral 5 a through hole for bonding formed in the lead frame 1 by a half-etching operation from the opposite surface as described later, and numeral 6 a wire bonding portion opposite to the lead terminal portion 3 of the lead 2. The wire bonding portion 6 is arranged in the central portion of the lead frame 1.

Figure 2A:
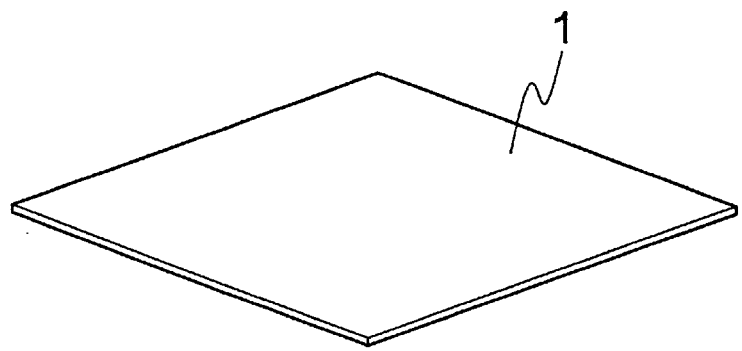
FIGS. 2(a)–2(d) are views showing steps of manufacturing a lead frame according to Embodiment 1 of the present invention.
Figure 3A:
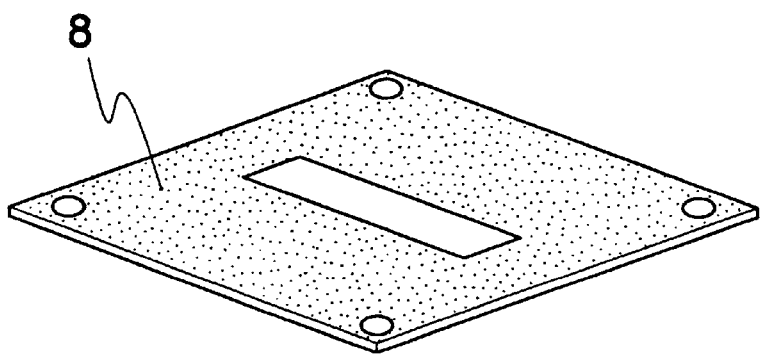
FIGS. 3(a)–3(c) are views showing steps of manufacturing a lead frame according to Embodiment 1 of the present invention.
Figure 3B:
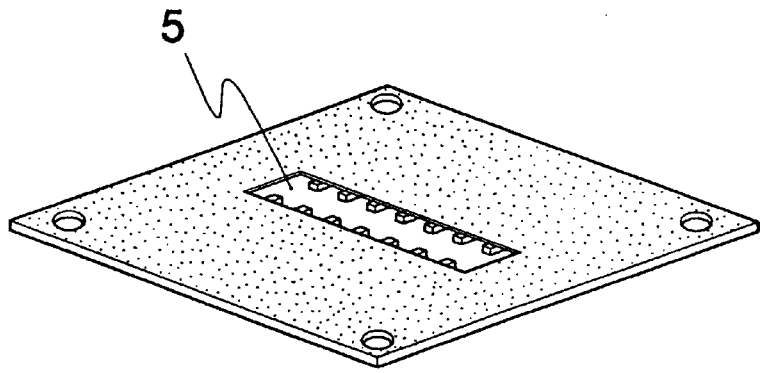

In FIGS. 2(a) and 3(b) numerals 7 and 8 denote resists.

In the lead frame 1 of FIG. 1, the leads 2 are not formed independently and are formed into independent leads in a step of manufacturing a semiconductor device.

A method for manufacturing a lead frame according to Embodiment 1 of the present invention will be described hereinafter using FIGS. 2(a)–2(d) and FIGS. 3(a)–3(c).

Figure 2B:
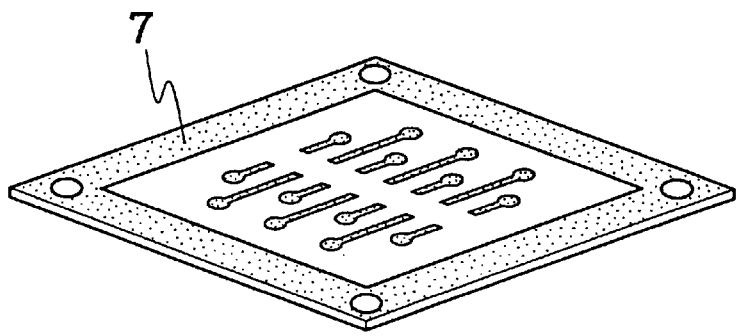
Figure 2C:
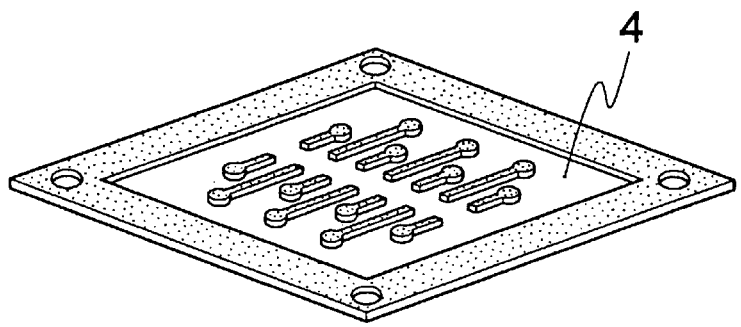
Figure 2D:
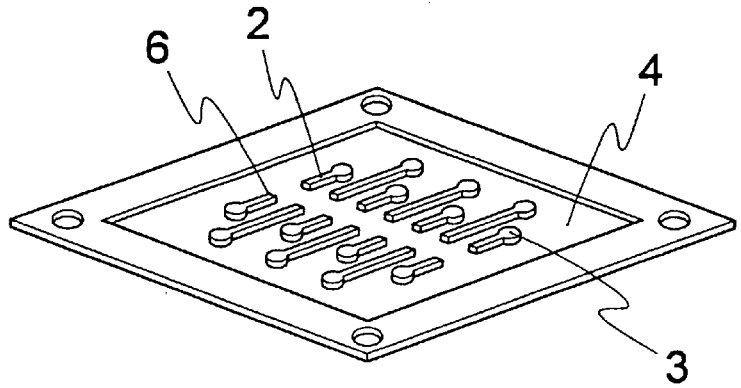

FIG. 2(a) is a perspective view of a lead frame 1 made of a copper-based or iron-based material where a pattern of a lead or the like is not formed at all. A resist 7 is formed in a pattern. This condition is shown in FIG. 2(b). Then, a pattern where the resist 7 is not present is removed in a half-etching operation. This condition is shown in FIG. 2(c). Thus, a half-etched portion 4 is formed. Then, the resist 7 is removed. This condition is shown in FIG. 2(d). Thus, each of the leads 2, lead terminal portions 3 and wire bonding portions 6 is partially formed. Generally, in a lead frame such as for a QFP (Quad flat package), a lead, a die pad, a tie bar and the like are formed at one time by punching or etching. In the lead frame 1 of Embodiment 1, the leads 2, lead terminal portions 3, wire bonding portions 6 and the like are formed by etching (half-etching) approximately half of frame thickness from one surface of the frame. The wire bonding portion 6, which is the tip end portion of the lead 2, is directed to a center of the lead frame 1 from a periphery of the lead frame.

FIG. 3(a) shows a rear surface of a lead frame. A resist 8 is formed on the surface which is opposite to the lead frame 1. This condition is shown in FIG. 3(a). A pattern where the resist 8 is not formed is removed in an half-etching operation. This condition is shown in FIG. 3(b). Thus, a through hole 5 for bonding is formed with a few mm of the wire bonding portion 6, which is a lead tip end, remaining.

The steps of FIG. 3(a) and FIG. 3(b) can be conducted simultaneously with the step of FIG. 2(b) and FIG. 2(c).

Figure 3C:
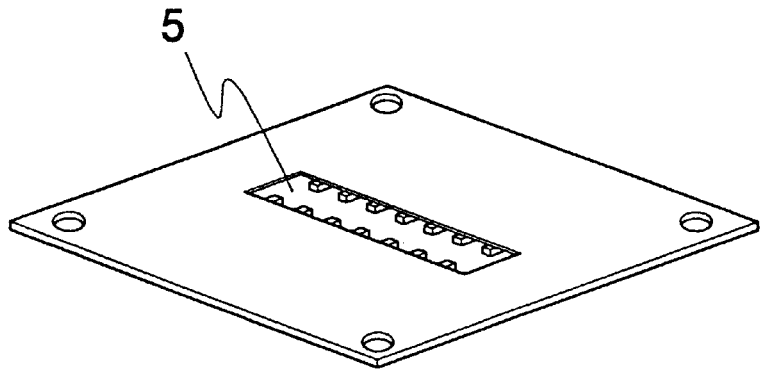

Then, the resist 8 is removed. This condition is shown in FIG. 3(c). FIG. 1 is a perspective view seen from the rear surface of the lead frame completed in this manner. The lead terminal portion 3 and the wire bonding portion 6 are silver-plated (not shown). In the lead frame 1, the leads are not formed independently and are formed into independent ones in a step of manufacturing a semiconductor device, thereby reducing defects, such as lead bending, in a lead frame single body.

Embodiment 2

Figure 4:
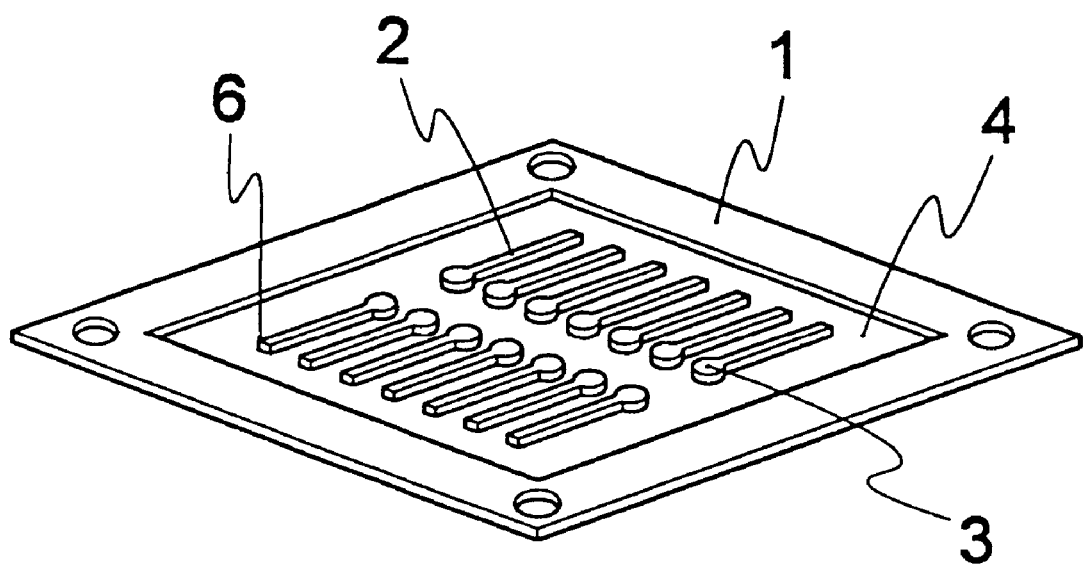
FIG. 4 is a perspective view showing a lead frame according to Embodiment 2 of the present invention.

FIG. 4 is a perspective view showing a lead frame according to Embodiment 2 of the present invention. FIGS. 5(a–5(c) are views showing a method for manufacturing the lead frame shown in FIG. 4.

In the drawings, although numerals 1 through 4 and 6 are the same as those of FIG. 1, a lead terminal portion 3 of the lead 2 is arranged in the central portion of the lead frame 1. The lead frame in Embodiment 2 has no through hole for bonding.

Figure 5A:
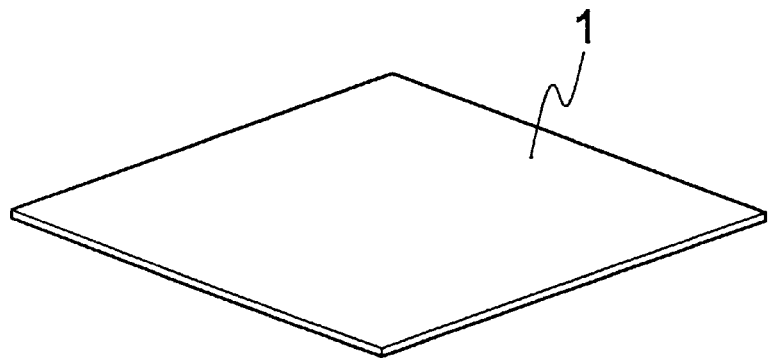
FIGS. 5(a)–5(c) are views showing steps of manufacturing a lead frame according to Embodiment 2 of the present invention.
Figure 5B:
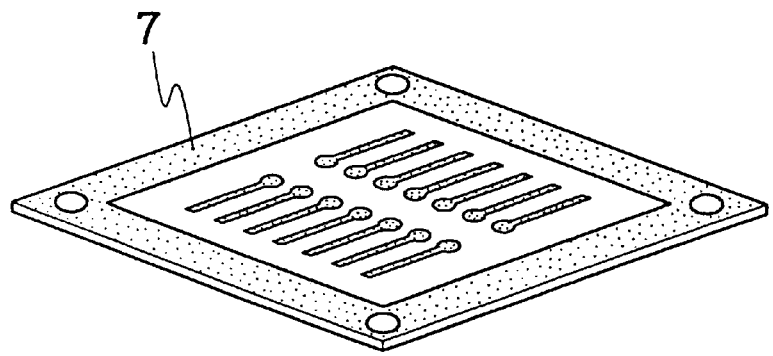

In FIG. 5(b), numeral 7 is a resist which is the same as that in FIG. 2.

Figure 5C:
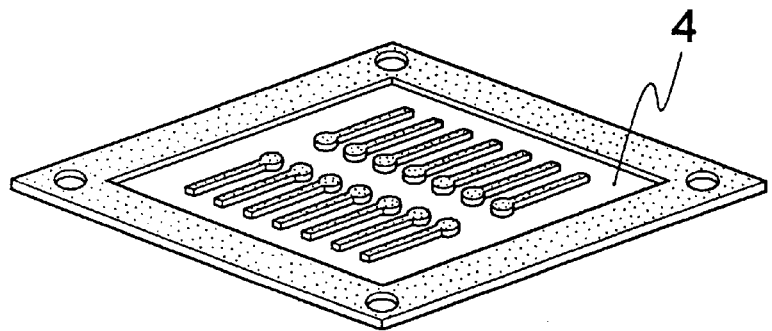

A method for manufacturing a lead frame according to Embodiment 2 of the present invention will be described hereinafter using FIGS. 5(a)–5(c).

FIG. 5(a) is a perspective view of a lead frame 1 made of a copper-based or iron-based material where a pattern of a lead or the like is not formed at all. Then, a resist 7 is formed in a pattern. This condition is shown in FIG. 5(*b*). A pattern where the resist 7 is not present is removed in a half-etching operation. This condition is shown in FIG. 5(*c*). Thus, a half-etched portion 4 is formed. Then, the lead frame shown in FIG. 4 is completed by removing the resist 7. Thus, each of the leads 2, lead terminal portions 3 and wire bonding portion 6 is partially formed.

Generally, in the lead frame such as for a QFP, a lead, a die pad, a tie bar and the like are formed at one time by punching or etching. In the lead frame 1 of Embodiment 2, the lead 2, lead terminal portion 3, wire bonding portion 6 and the like are formed by etching (half-etching) approximately half of the frame thickness from one surface of the frame. The wire bonding portion 6 which is a tip end of the lead 2 is directed toward a periphery of the lead frame 1 from the center thereof. FIG. 4 is a perspective view of the completed lead frame. The lead terminal portion 3 and the wire bonding portion 6 are silver-plated (not shown).

In the lead frame 1, the leads are not formed independently and are formed into independent leads in a step of manufacturing a semiconductor device, thereby reducing defects, such as lead bending, in a lead frame single body.

Embodiment 3

Figure 6:
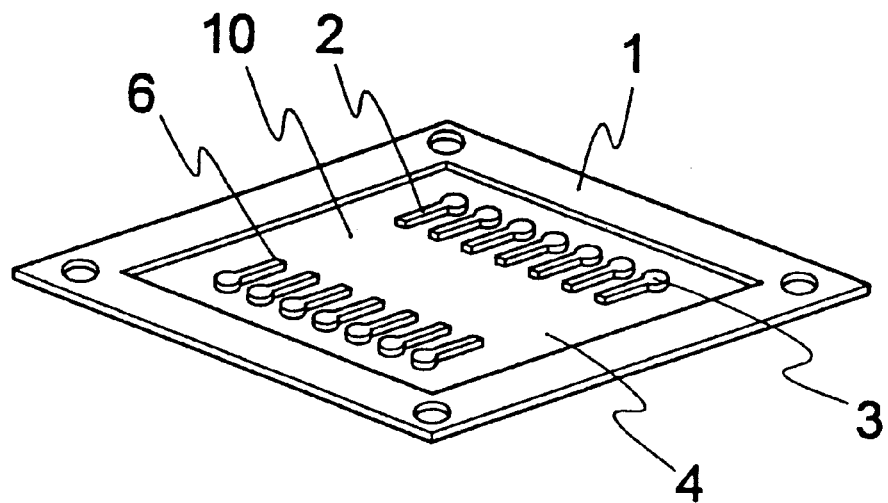
FIG. 6 is an perspective view showing a lead frame according to Embodiment 3 of the present invention.
Figure 7:
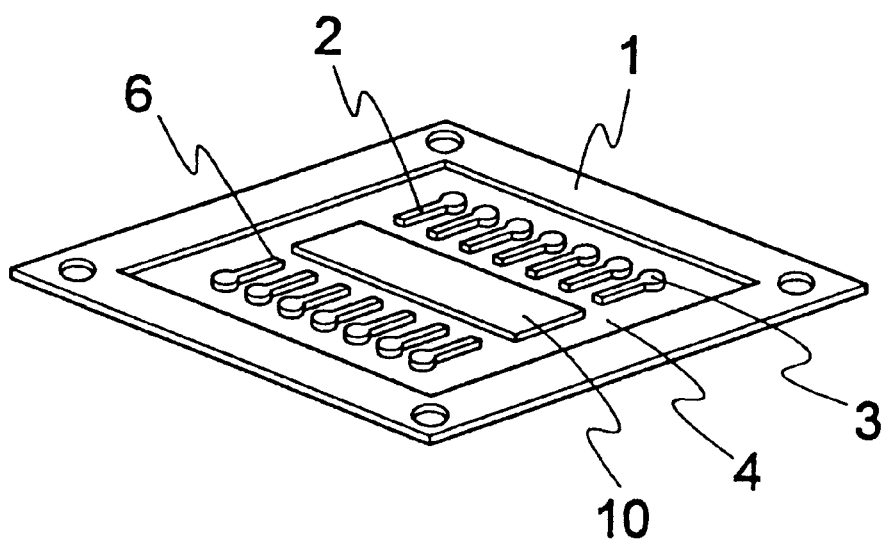
FIG. 7 is a perspective view showing a lead fame according to Embodiment 3 of the present invention.

FIGS. 6 and 7 are perspective views each showing a lead frame according to Embodiment 3 of the present invention. In the drawings, although numerals 1 through 4 and 6 are the same as those of FIG. 4, a wire bonding portion 6 of the lead 2 is arranged in the central portion. Numeral 10 denotes a die bonding portion provided in the central portion of the lead frame 1.

In FIG. 6, the die bonding portion 10 is half-etched, while in FIG. 7, the die bonding portion 10 remains without being half-etched.

A method for manufacturing a lead frame according to Embodiment 3 is the same as that of Embodiment 2, which is shown in FIGS. 5(*a*)–5(*c*). A semiconductor device with superior thermal dispersion property can be obtained by providing the die bonding portion 10.

Embodiment 4

Figure 8:
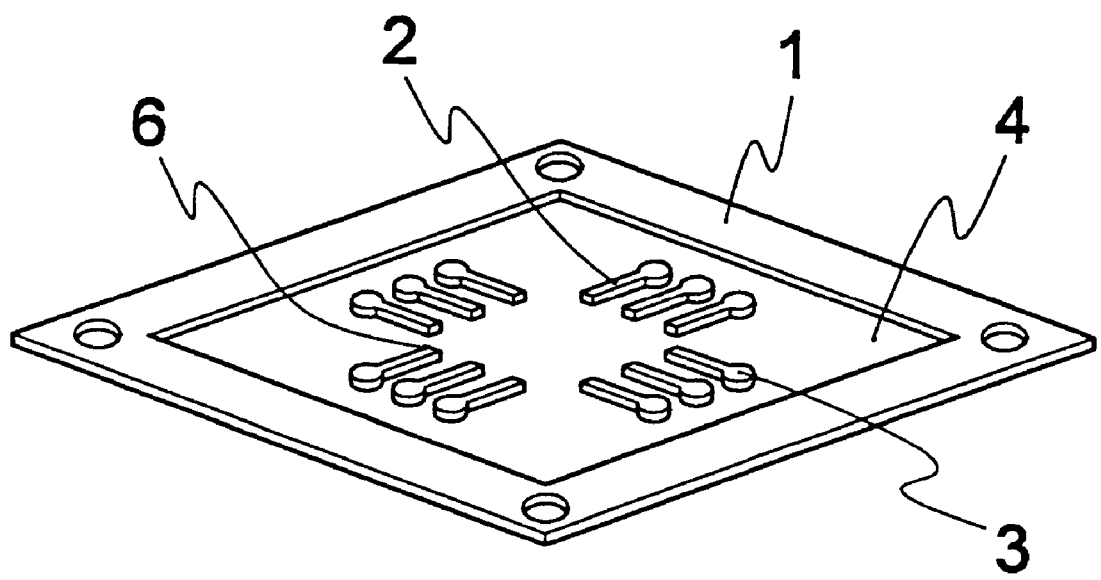
FIG. 8 is a perspective view showing a lead frame according to Embodiment 4 of the present invention.
Figure 9A:
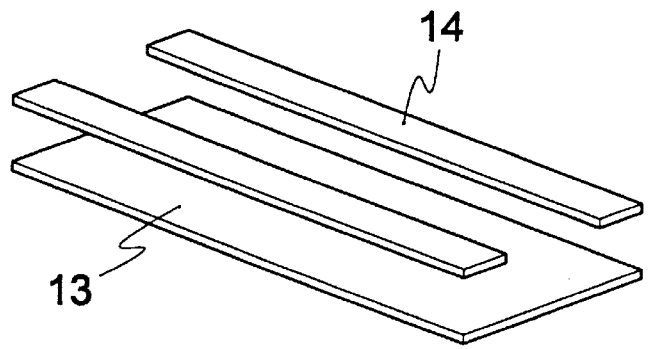
FIGS. 9(a)–9(e) are views showing steps of manufacturing a semiconductor device according to Embodiment 5 of the present invention.
Figure 9B:
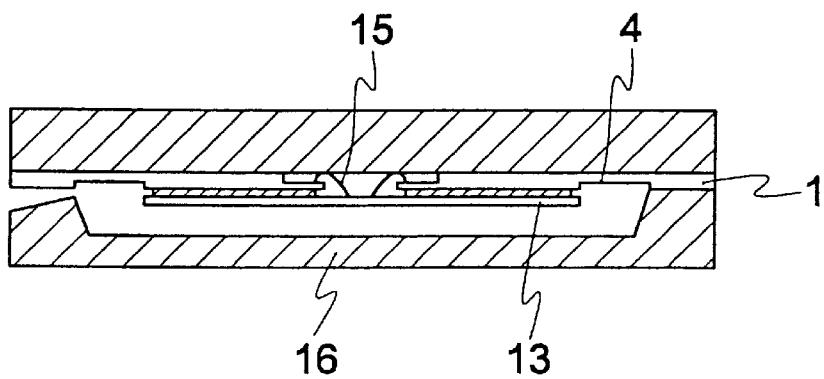
Figure 9C:
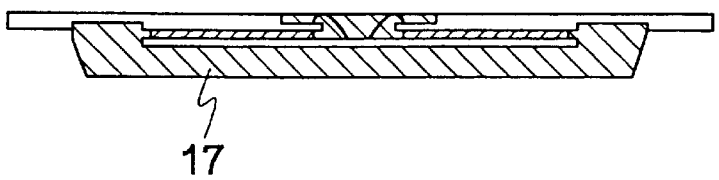
Figure 9D:
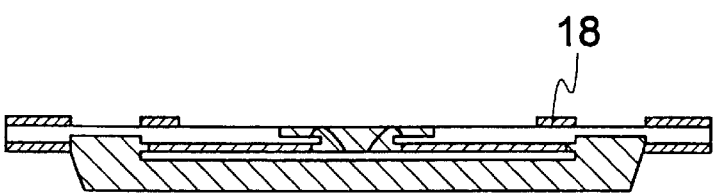
Figure 9E:
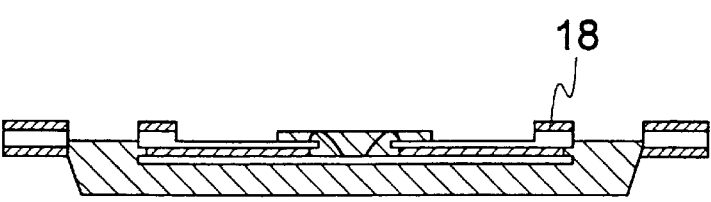
Figure 10A:
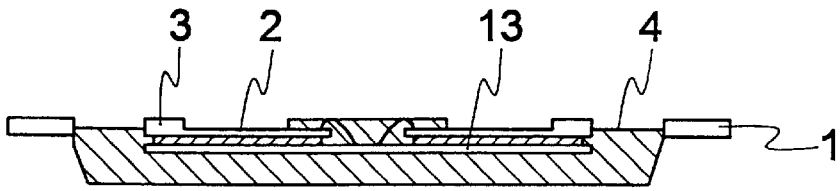
FIGS. 10(a)–10(d) are views showing steps of manufacturing another semiconductor device according to Embodiment 5 of the present invention.
Figure 10B:
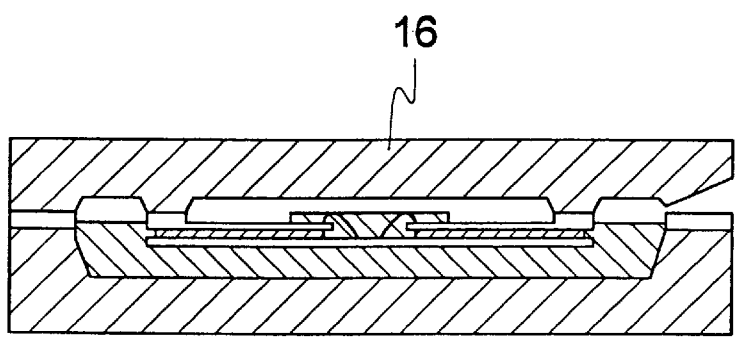
Figure 10C:
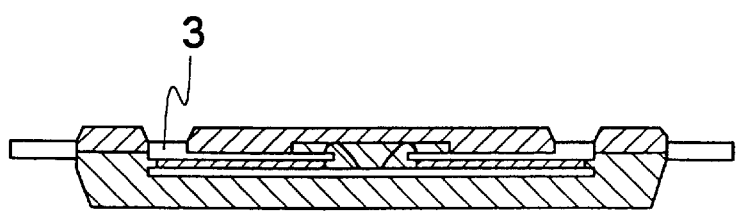
Figure 10D:
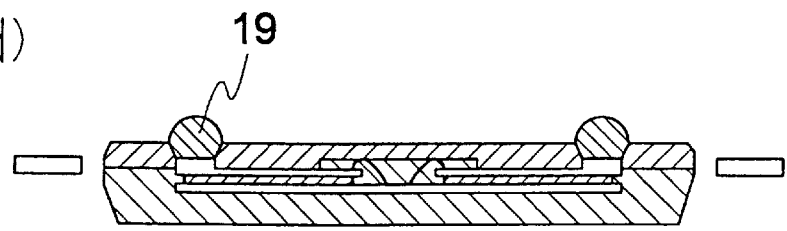
Figure 11A:
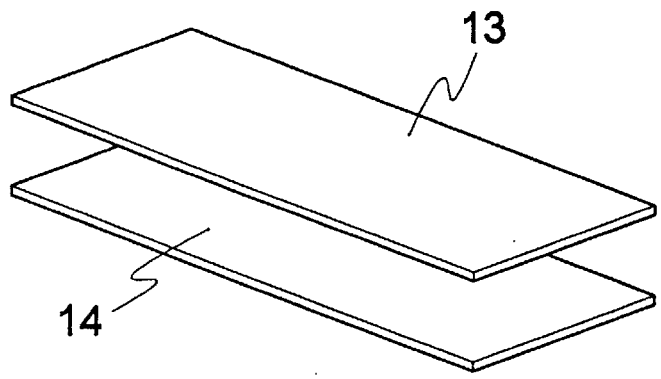
FIGS. 11(a)–11(e) are views showing steps of manufacturing a semiconductor device according to Embodiment 6 of the present invention.
Figure 11B:
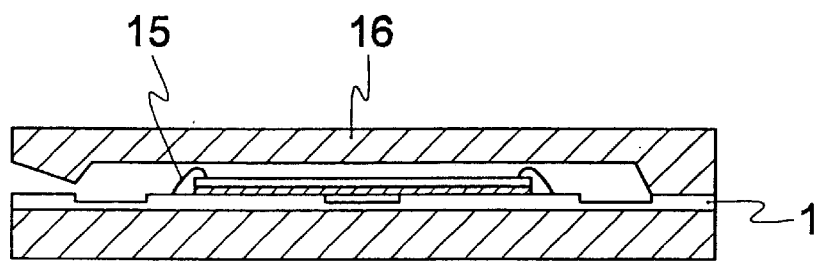
Figure 11C:
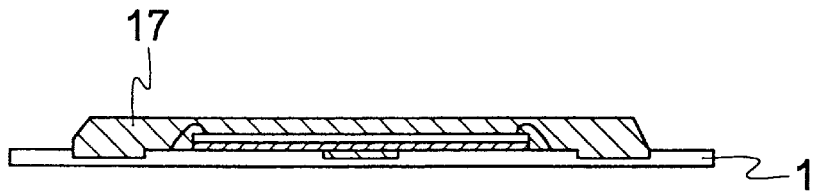
Figure 11D:
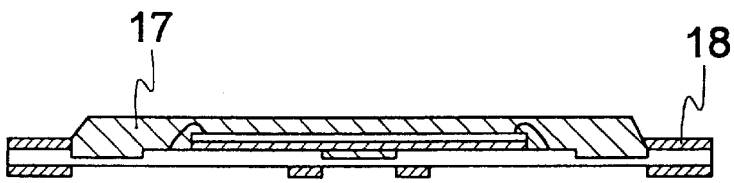
Figure 11E:
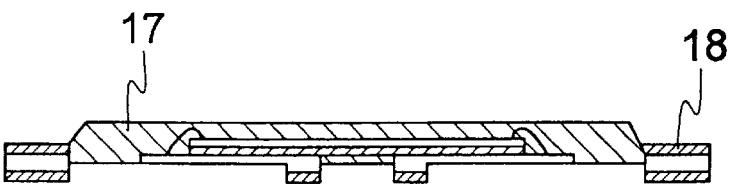

FIG. 8 is a perspective view showing a lead frame according to Embodiment 4 of the present invention. In the drawing, although numerals I through 4 and 6 are the same as those of FIG. 6, a lead 2 is arranged directed toward to each of four sides of the lead frame 1 from the central portion thereof.

A method for manufacturing a lead frame according to Embodiment 4 is the same as that of Embodiment 2, which is shown in FIGS. 5(*a*)–5(*c*). Also in Embodiment 4 a die bonding portion can be provided as in Embodiment 3.

Embodiment 5

Embodiment 5 relates to a method for manufacturing a semiconductor device using a lead frame shown in FIG. 1. Thus, Embodiment 5 will be described with the use of FIG. 1.

FIGS. 9(*a*)–9(*e*) and FIGS. 10(*a*)–10(*d*) are views showing a method for manufacturing a semiconductor device. In the drawings, numerals 1 and 3 are the same as those in FIG. 1. Numeral 13 denotes a chip which is a semiconductor integrated circuit, numeral 14 an adhesive for bonding the chip 13 to a lead frame 1, and numeral 15 a wire for connecting a bonding pad portion of the chip 13 with a wire bonding portion of the lead frame 1. Numeral 16 denotes a metal mold for molding, numeral 17 a molding resin, numeral 18 a resist, and numeral 19 a soldering ball.

A chip 13, which is a semiconductor integrated circuit shown in FIG. 9(*a*), is mounted on a lead frame 1 with an adhesive 14. A bonding pad portion of the chip 13 is connected with a wire bonding portion 6 of a lead frame 1 by means of a wire 15 made of metal or the like. In order to mold the mounting surface of the chip 13, the lead frame 1 is attached to a metal mold 16 for molding. This condition is shown in FIG. 9(*b*). FIG. 9 (*c*) shows a condition where the lead frame is taken out of the metal mold 16 for molding after a chip mounting surface is covered with a mold resin 17.

In order to half-etch the surface of the lead frame 1 on which the chip 13 is not mounted, a resist 18 is formed on a portion which is not to be etched. This condition is shown in FIG. 9(*d*). The half-etched lead frame is shown in FIG. 9(*e*). FIG. 10(*a*) shows a condition where the resist 18 is removed. The resist can be removed after molding. In order to mold the surface of the lead frame 1 on which the chip 13 is mounted, the lead frame 1 is attached to a metal mold 16 for molding. This condition is shown in FIG. 10(*b*). FIG. 10(*c*) shows a condition where the lead frame is taken out of the metal mold 16 after molding. As shown in FIG. 10(*d*), a soldering ball 19 is provided on the lead terminal portion 3 to complete a semiconductor device.

Embodiment 6

Embodiment 6 relates to a method for manufacturing a semiconductor device using a lead frame shown in FIG. 4. Thus, Embodiment 6 will be described with the use of FIG. 4.

FIGS. 11(*a*)–11(*e*) and FIGS. 12(*a*)–12(*d*) are views showing a method for manufacturing a semiconductor device. In the drawings, numerals 1, 3, and 13 through 19 are the same as those in FIGS. 9(*a*)–9(*e*) and FIGS. 10(*a*)–10(*d*).

A chip 13, which is a semiconductor integrated circuit, is mounted on a lead frame 1 with an adhesive 14 as shown in FIG. 11(*a*). A bonding pad of the chip 13 is connected with a wire bonding portion 6 of a lead frame 1 by means of a wire 15 made of metal or the like. In order to mold the mounting surface of the chip 13, the lead frame 1 is attached to a metal mold 16 for molding. This condition is shown in FIG. 11(*b*). FIG. 11(*c*) shows a condition where the lead frame is taken out of the metal mold 16 for molding after a chip mounting surface is covered with a mold resin 17.

In order to half-etch the surface of the lead frame 1 on which the chip 13 is not mounted, a resist 18 is formed on a portion which is not to be etched. This condition is shown in FIG. 11(*d*). The half-etched lead frame is shown in FIG. 11(*e*). FIG. 12(*a*) shows a condition where the resist 18 has been removed. The resist can be removed after molding. In order to mold the surface of the lead frame 1 on which the chip 13 is mounted, the lead frame 1 is attached to a metal mold 16 for molding. This condition is shown in FIG. 12(*b*). FIG. 12(*c*) shows a condition where the lead frame is taken out of the metal mold 16 for molding. As shown in FIG. 12(*d*), a soldering ball 19 is provided on the lead terminal portion 3 to complete a semiconductor device.

Embodiment 7

Embodiment 7 relates to a method for manufacturing a semiconductor device using a lead frame shown in FIG. 6. Embodiment 7 will be described with the use of FIG. 6.

FIGS. 13(a)–13(e) and FIGS. 14(a)–14(d) are views showing a method for manufacturing a semiconductor device. In the drawings, numerals 1, 3, and 13 through 19 are the same as those in FIG. 9 and FIG. 10.

Figure 13A:
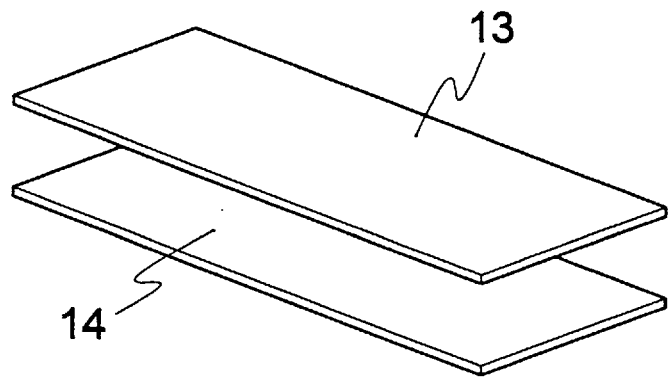
FIGS. 13(a)–13(e) are views showing steps of manufacturing a semiconductor device according to Embodiment 7 of the present invention.
Figure 13B:
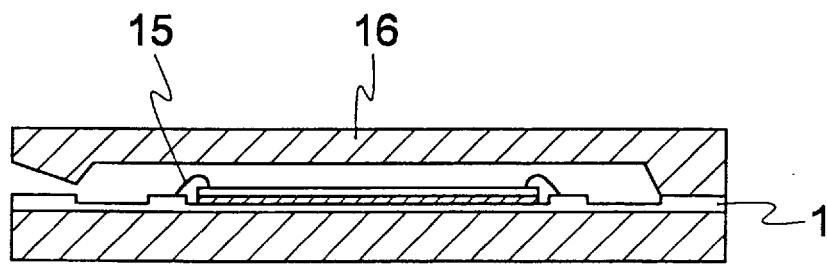
Figure 13C:
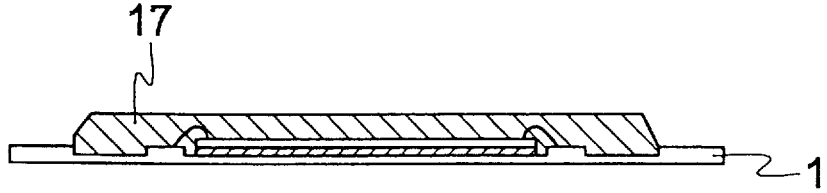
Figure 13D:
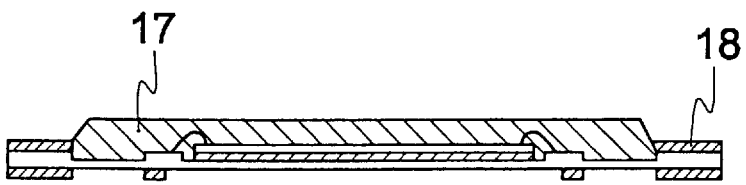
Figure 13E:
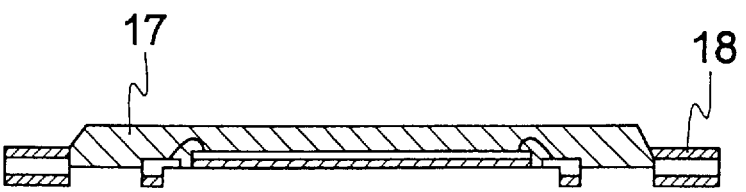
Figure 14A:
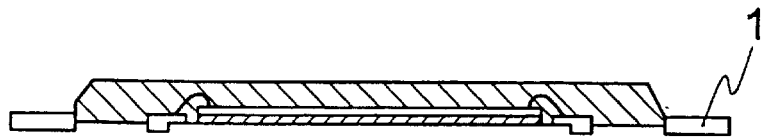
FIGS. 14(a)–14(d) are views showing steps of manufacturing a semiconductor device according to Embodiment 7 of the present invention.

A chip 13, which is a semiconductor integrated circuit, is mounted on a lead frame 1 with an adhesive 14 as shown in FIG. 13(a). A bonding pad portion of the chip 13 is connected with a wire bonding portion 6 of a lead frame 1 by means of a wire 15 made of metal or the like. In order to mold the mounting surface of the chip 13, the lead frame 1 is attached to a metal mold 16 for molding. as shown in FIG. 13(b). FIG. 13(c) shows a condition where the lead frame is taken out of the metal mold 16 for molding after a chip mounting surface is covered with a mold resin 17. In order to half-etch the surface of the lead frame 1 on which the chip 13 is not mounted, a resist 18 is formed on a portion which is not to be etched. This condition is shown in FIG. 13(d). The half-etched lead frame is shown in FIG. 13(e). FIG. 14(a) shows a condition where the resist 18 is removed. The resist can be removed after molding.

Figure 14B:
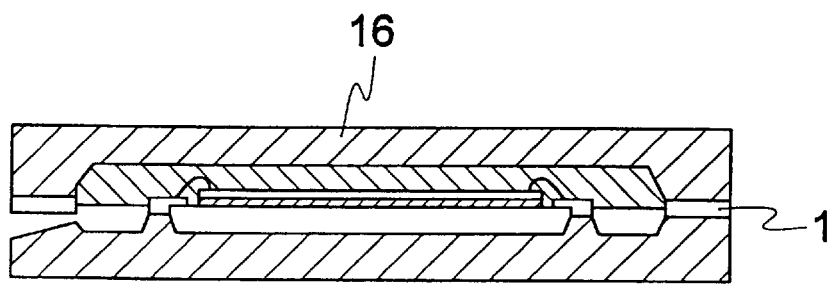
Figure 14C:
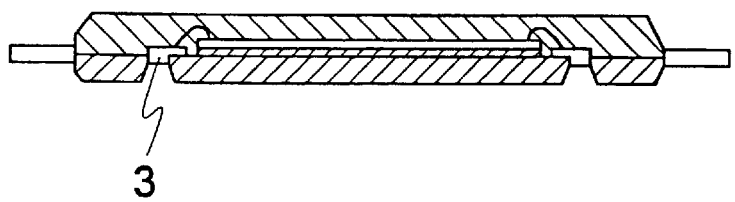
Figure 14D:
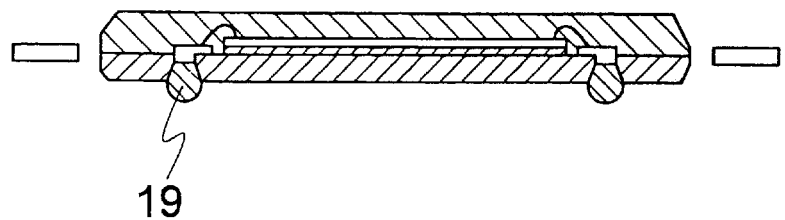

In order to mold the surface of the lead frame 1 on which the chip 13 is mounted, the lead frame 1 is attached to a metal mold 16 for molding. This condition is shown in FIG. 14(b). FIG. 14(c) shows a condition where the lead frame is taken out of the metal mold 16 for molding. A soldering ball 19 is provided on the lead terminal portion 3 as shown in FIG. 14(d) to complete a semiconductor device.

Embodiment 8

Figure 15:
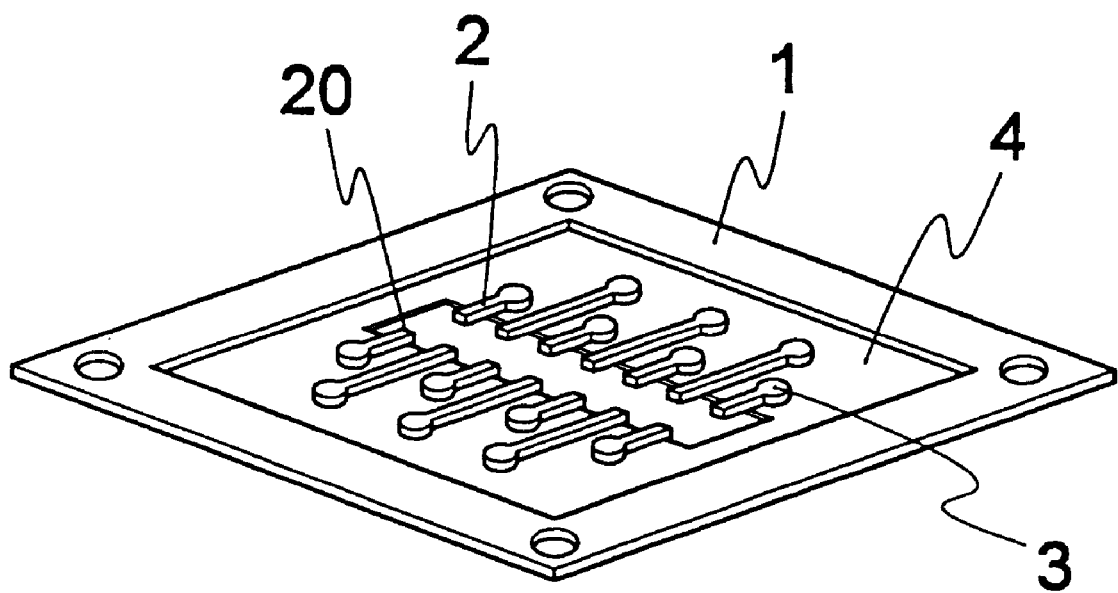
FIG. 15 is a perspective view showing a lead frame according to Embodiment 8 of the present invention.

Embodiment 8 relates to a method for manufacturing a semiconductor device using a lead frame shown in FIG. 15.

FIG. 15 is a perspective view showing a lead frame according to Embodiment 8 of the present invention. In the drawing, numerals 1 through 4 are the same as those in FIG. 1. Numeral 20 is a bump connecting portion provided opposite to the lead terminal portion 3 of the lead 2 and arranged in the central portion of the lead frame 1.

FIGS. 16(a)–16(e) and FIGS. 17(a)–17(d) are views showing a method for manufacturing a semiconductor device. In the drawings, numerals 1, 3 and 13 through 19 are the same as those in FIGS. 9(a)–9(e). Numeral 21 denotes a soldering bump.

Figure 16A:
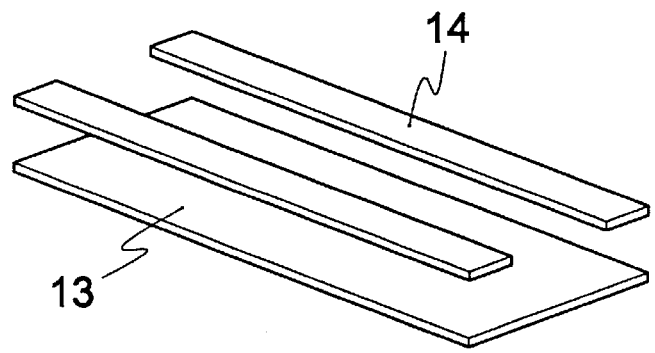
FIGS. 16(a)–16(e) are views showing steps of manufacturing a semiconductor device according to Embodiment 8 of the present invention.
Figure 16B:
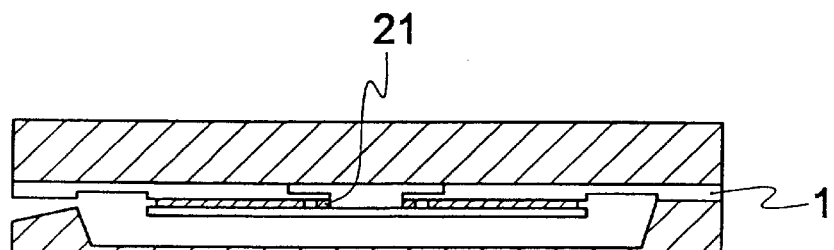
Figure 16C:
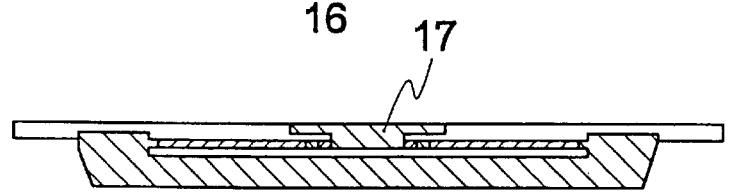

A chip 13 which is a semiconductor integrated circuit shown in FIG. 16(a) is mounted on a lead frame 1 with an adhesive 14. A bonding pad portion of the chip 13 is electrically connected with a bump connecting portion 20 of the lead frame 1 by a soldering bump 21 made of solder. In order to mold the mounting surface of the chip, the lead frame is attached to a metal mold 16 for molding. This condition is shown in FIG. 16(b). FIG. 16(c) shows a condition where the lead frame is taken out of the metal mold 16 for molding after a chip mounting surface is covered with a mold resin 17.

Figure 16D:
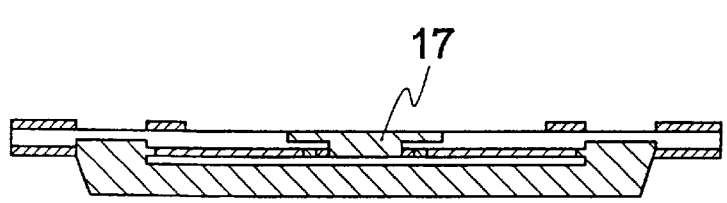
Figure 16E:
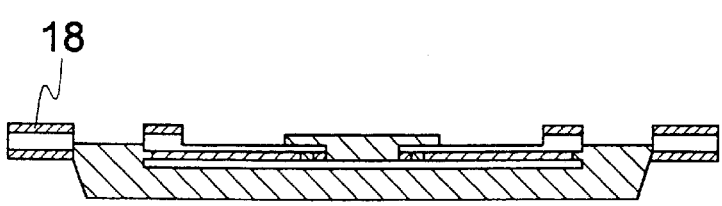
Figure 17A:
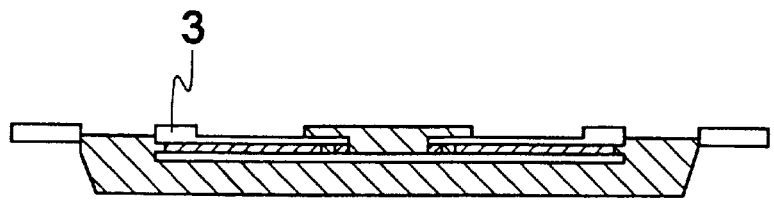
FIGS. 17(a)–17(d) are views showing steps of manufacturing a semiconductor device according to Embodiment 8 of the present invention.
Figure 17B:
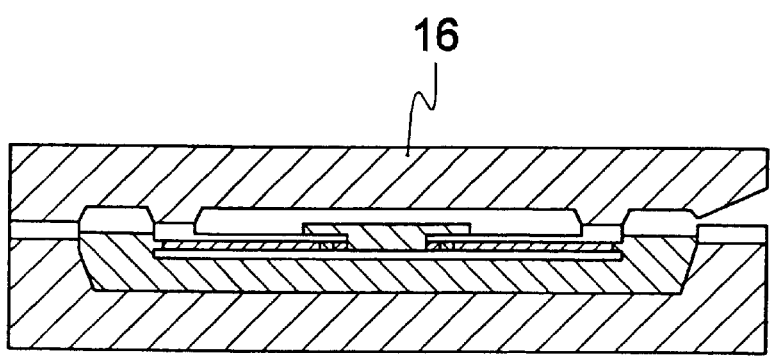
Figure 17C:
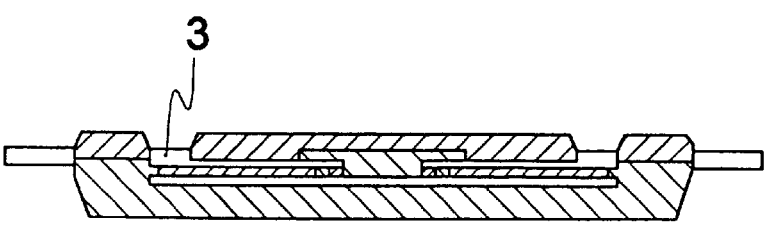
Figure 17D:
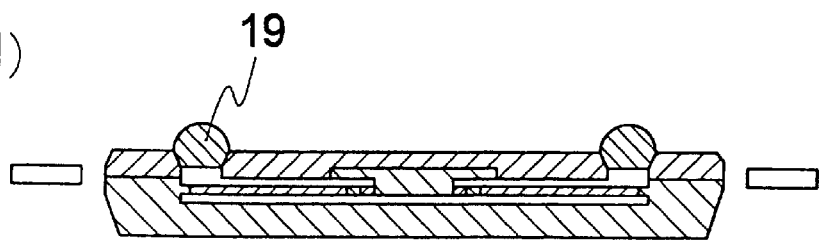
Figure 19:
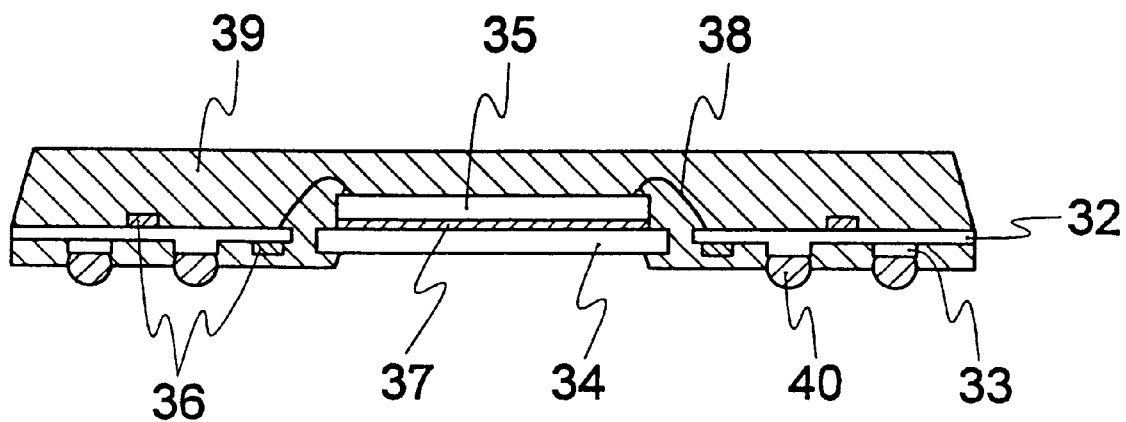
FIG. 19 is a sectional view showing a semiconductor device using the conventional lead frame.

In order to half-etch the surface of the lead frame 1 on which the chip 13 is not mounted, a resist 18 is formed on a portion which is not to be etched. This condition is shown in FIG. 16(d). The half-etched lead frame is shown in FIG. 16(e). FIG. 17(a) shows a condition where the resist 18 is removed. The resist can be removed after molding. In order to mold the surface of the lead frame 1 on which the chip 13 is mounted, the lead frame 1 is attached to a metal mold 16 for molding. This condition is shown in FIG. 17(b). FIG. 17(c) shows a condition where the lead frame is taken out of the metal mold 16 for molding. A soldering ball 19 is provided on the lead terminal portion 3 to complete a semiconductor device.

When a lead frame for CSP (Chip Scale Package) is used as a lead frame in the above embodiment, other effects can be expected due to necessity of the precise processing. In the CSP structure, as one example, a pad electrode and a bump electrode on a chip are electrically connected with a metal wiring pattern on the chip. The wiring pattern is formed in a wafer process. Thus, fine processing can be conducted, but cost becomes higher. A lead frame of the present invention, however, allows fine processing with a lower manufacturing cost.

In Embodiments 5 through 8, a surface of the lead frame 1 on which the chip 13 is not mounted is molded. But it is not necessarily molded. Resin can be applied to the surface.

Since the present invention is constructed as described above, the following effects can be achieved.

A concavity is formed in a first surface of a conductive base plate through etching by masking lead forming portions arranged on the first surface, and a semiconductor element is mounted on the first surface. Therefore, the lead forming portions are coupled with one another by the concave portion, and are not independent. Thus, the inferior bending of the lead forming portion in a lead frame single body is avoided.

Since the lead forming portion extends towards a central portion from the peripheral portion of the conductive base plate, a plurality rows of lead terminal portions can be obtained.

The conductive base plate has four sides, and the lead forming portion is so arranged as to extend towards the central portion from each side of the conductive base plate. Therefore, the arrangement of the lead terminal portion can be made parallel to each of four sides.

In the lead forming portion, the lead terminal portion is arranged in the peripheral portion of the conductive base plate and the connecting portion to be connected with the semiconductor element is arranged in the central portion of the conductive base plate. Thus, the lead terminal portion can be provided in the peripheral portion of the conductive base plate.

Since a die bonding portion on which the semiconductor element is mounted is provided in the central portion of the first surface of the conductive base plate, a semiconductor device having a good thermal dispersion property can be obtained.

In the central portion of the second surface of the conductive base plate, there is formed a concave portion reaching a concave portion of the first surface, and the end portion of the lead forming portion of the first surface is exposed. A connecting portion to be connected with a semiconductor element can be provided on the side of the second surface, thus increasing the possibility of free connection.

In the lead forming portion, the lead terminal portion is arranged in the peripheral portion of the conductive base plate, and the connecting portion to be connected with the semiconductor element is arranged in the peripheral portion of the conductive base plate. Thus, the lead terminal portion can be provided in the central portion of the conductive base plate.

In a semiconductor device where a semiconductor element is mounted on a first surface of the conductive base plate of the lead frame, and the first surface and the semiconductor element are sealed with resin, the second surface of the conductive base plate is etched to form a lead. It can be applied even in the semiconductor device of a CSP or the like with the use of a lead which is easier to finely work.

A method for manufacturing a semiconductor device of the invention comprises a first step of forming a concavity by etching after masking at least a lead forming portion on a first surface of a lead frame, a second step of mounting a semiconductor element on the first surface and connecting the semiconductor element with the lead forming portion, a third step of sealing the first surface and the semiconductor element with resin, a fourth step of etching a second surface opposite to the first surface of the lead frame to form a lead, and a fifth step of covering the second surface with an insulating member except the terminal portion of the lead. Accordingly, there can be manufactured a semiconductor device with a high reliability using a lead frame which is less in inferior bending in a lead frame single body and can be worked finely.

In addition, the second step is conducted after etching the central portion of the second surface opposite to the first surface of the lead frame to form a concavity reaching a concavity on the first surface of the lead frame, and exposing an end portion of the lead forming portion of the first surface. Accordingly, a connecting portion to be connected with a semiconductor element can be provided on the side of the second surface, thus increasing possibility of free connection.

The first step simultaneously conducts forms the concavity on the first surface of the lead frame and forms a concavity reaching a concavity on the first surface in the central portion of the second surface, by etching, for exposing the end portion of the lead forming portion of the first lead. The possibility of free connection can be increased without increasing the number of the steps.

Another method for manufacturing a lead frame of the present invention comprises a first step of forming a concavity by etching after masking at least a lead forming portion on a first surface of a conductive base plate, and a second step of etching a central portion of a second surface opposite to the first surface of the conductive base plate to form a concavity reaching a concavity of the first surface of the lead frame, and exposing an end of the lead forming portion of the first surface. Accordingly, a connecting portion of a lead to be connected with a semiconductor element can be provided on the side of the second surface, making a lead with increased possibility of free connection between the lead and semiconductor element.

Furthermore, since the first step and the second step are conducted at the same time, a lead frame can be provided wherein the possibility of free connection between the lead and semiconductor element increases without increasing the number of the steps.

What is claimed is:

1. A lead frame comprising a unitary electrically conductive base plate including:
    opposed first and second surfaces, the second surface being planar and the first surface having:
        a peripheral frame with a first thickness;
        a central portion within the peripheral frame for mounting a semiconductor element and having a second thickness smaller than the first thickness; and
        a lead-forming portion, within the central portion and having a plurality of raised portions with a third thickness substantially equal to the first thickness minus the second thickness, for forming leads.

2. The lead frame of claim 1 wherein the raised portions extend inwardly with respect to the peripheral frame.

3. The lead frame of claim 1 wherein the peripheral frame has four sides and the lead-forming portion includes respective raised portions extending inwardly with respect to each side of the peripheral frame.

4. The lead frame of claim 1 wherein the raised portions include respective first and second ends, a lead terminal at the first end, and a connecting portion for connection to a semiconductor element at the second end, wherein the first end is closer to the peripheral frame than the second end.

5. The lead frame of claim 1 wherein the central portion includes a die bonding portion for mounting of a semiconductor element.

6. The lead frame of claim 1 wherein the central portion includes a centrally located opening extending through the unitary electrically conducting base plate and respective ends of the raised portions are disposed adjacent the opening.

7. The lead frame of claim 1 wherein the raised portions include respective first and second ends, a connecting portion for connection to a semiconductor element at the first end, and a lead terminal at the second end, wherein the first end is closer to the peripheral frame than the second end.

8. The-lead frame of claim 2 wherein the raised portions include respective first and second ends, a lead terminal at the first end, and a connecting portion for connection to a semiconductor element at the second end, wherein the first end is closer to the peripheral frame than the second end.

9. The lead frame of claim 2 wherein the central portion includes a die bonding portion for mounting of a semiconductor element.

10. The lead frame of claim 2 wherein the central portion includes a centrally located opening extending through the unitary electrically conducting base plate and respective ends of the raised portions are disposed adjacent the opening.

11. The lead frame of claim 2 wherein the raised portions include respective first and second ends, a connecting portion for connection to a semiconductor element at the first end, and a lead terminal at the second end, wherein the first end is closer to the peripheral frame than the second end.

12. The lead frame of claim 3 wherein the raised portions include respective first and second ends, a lead terminal at the first end, and a connecting portion for connection to a semiconductor element at the second end, wherein the first end is closer to the peripheral frame than the second end.

13. The lead frame of claim 3 wherein the central portion includes a die bonding portion for mounting of a semiconductor element.

14. The lead frame of claim 3 wherein the central portion includes a centrally located opening extending through the unitary electrically conducting base plate and respective ends of the raised portions are disposed adjacent the opening.

15. The lead frame of claim 3 wherein the raised portions include respective first and second ends, a connecting portion for connection to a semiconductor element at the first end, and a lead terminal at the second end, wherein the first end is closer to the peripheral frame than the second end.

16. A semiconductor device comprising:
    a lead frame including a unitary electrically conductive base plate comprising:
        opposed first and second surfaces, the second surface being planar and the first surface having
        a peripheral frame having a first thickness,
        a central portion within the peripheral frame for mounting a semiconductor element and having a second thickness smaller than the first thickness, and
        a lead-forming portion within the central portion and having a plurality of raised leads with a third thickness, substantially equal to the first thickness minus the second thickness, a semiconductor element mounted on the central portion within the peripheral frame, the semiconductor element being electrically connected to the leads;

a resin covering the semiconductor element and the central portion; and an insulating material covering the second side of the electrically conductive base plate, opposite the central portion on which the semiconductor element is mounted.

* * * * *